(12) United States Patent
Hudson

(10) Patent No.: US 6,262,578 B1
(45) Date of Patent: Jul. 17, 2001

(54) DETECTION AND LOCATION OF CURRENT LEAKAGE PATHS AND DETECTION OF OSCILLATIONS

(75) Inventor: Steven Martin Hudson, Dorset (GB)

(73) Assignee: Flight Refuelling Limited, Dorset (GB)

( * ) Notice: Subject to any disclaimer, the term of this patent is extended or adjusted under 35 U.S.C. 154(b) by 0 days.

(21) Appl. No.: 09/011,496

(22) PCT Filed: Aug. 8, 1996

(86) PCT No.: PCT/GB96/01926

§ 371 Date: Feb. 9, 1998

§ 102(e) Date: Feb. 9, 1996

(87) PCT Pub. No.: WO97/06443

PCT Pub. Date: Feb. 20, 1997

(30) Foreign Application Priority Data

Aug. 9, 1995 (GB) ................................................. 9516304

(51) Int. Cl.⁷ .................................................. G01R 31/08
(52) U.S. Cl. ........................................... 324/522; 324/527
(58) Field of Search .................................. 324/522, 523, 324/525, 527, 528, 539, 67, 66

(56) References Cited

U.S. PATENT DOCUMENTS

| | | | | |
|---|---|---|---|---|
| 4,559,491 | * | 12/1985 | Saha | 324/523 |
| 4,795,983 | * | 1/1989 | Crockett et al. | 324/523 |
| 4,839,598 | * | 6/1989 | Calvert et al. | 324/522 |
| 4,918,977 | * | 4/1990 | Takahashi et al. | 324/539 |
| 4,947,469 | * | 8/1990 | Vokey et al. | 324/523 |
| 5,270,661 | * | 12/1993 | Burnett | 324/527 |
| 5,321,363 | * | 6/1994 | Wakamatsu et al. | 324/523 |
| 5,530,365 | * | 6/1996 | Lefeldt | 324/527 |
| 5,708,364 | * | 1/1998 | Vokey et al. | 324/523 |
| 5,990,686 | * | 11/1999 | Vokey et al. | 324/523 |

FOREIGN PATENT DOCUMENTS

| | | |
|---|---|---|
| 3727224 | 2/1989 | (DE) . |
| 0038400 | 10/1981 | (EP) . |

OTHER PUBLICATIONS

International Preliminary Examination report dated Nov. 11, 1997 (9 pages).

* cited by examiner

Primary Examiner—Safet Metjahic
Assistant Examiner—Jermele M. Hollington
(74) Attorney, Agent, or Firm—Finnegan, Henderson, Farabow, Garrett, & Dunner, L.L.P.

(57) ABSTRACT

An apparatus and method for detecting and locating electric current leakage paths along the length of an electrically conducting elongate member. The apparatus has a variable supply device and a meter device for monitoring the impedance of the member (9, 11), the supply device being operable to drive current in opposite directions along the member, so that a movable node can be established, the node being where the net change in potential between the member and its surroundings is substantially zero. When the apparatus is in use, the position of the node is varied by varying the current driven along the member and the resultant impedance is monitored by the monitoring meter device, whereby the position of the node at which there is a local minimum in the impedance indicates the position of a current leakage path.

17 Claims, 3 Drawing Sheets

DETECTION AND LOCATION OF CURRENT LEAKAGE PATHS AND DETECTION OF OSCILLATIONS

BACKGROUND OF THE INVENTION

1. Field of the Invention

This invention relates to a method and apparatus for detecting and locating current leakage paths along the length of an electrically conducting elongate member, in particular pipes or cables. This invention also relates to a method for detecting oscillatory motion of such an elongate member under water.

2. Description of the Related Art

The type of pipe or cable to which the method of the present invention can be applied is one which is electrically conducting along its length and in its ideal state is electrically insulated from its surroundings. However, in the event of corrosion along the length of such pipes, electric current leakage paths are formed between the pipe and its surroundings. In order to detect corrosion, or other forms of damage which result in the formation of leakage paths along the length of a pipe, a typical method involves connecting a section of the pipe to a Wheatstone bridge type arrangement thereby enabling its resistance to be measured and using this resistance to determine whether there are any leakage paths formed between the pipe and its surroundings. However, this has the disadvantage that whilst an electric current leakage path can be detected, the location of that leakage path can be difficult to determine. In addition, this method requires that the pipe is probed extensively along its length and this can be time consuming and when the pipe is underground or under water, very expensive. Another method of detecting corrosion is to merely visually inspect the pipes which again is very expensive.

DE-A-3727224 discloses a measuring system for locating leakage faults on cables in which a pair of parallel conductors sheathed in an insulating material are connected into a bridge circuit and the location of a fault in the insulating material that leads to a leakage is determined by balancing the bridge circuit.

SUMMARY OF THE INVENTION

An object of the present invention is to enable detection and location of electric current leakage paths along the length of a single electrically conducting elongate member without having to probe the member extensively, thereby facilitating the location of such leakage paths and reducing the overall cost of the operation.

According to one aspect of this invention there is provided a method for detecting and locating electric current leakage paths along the length of an electrically conducting elongate member which in its ideal state is electrically insulated from its surroundings, said leakage paths and said surroundings being such that current can leak from the elongate member to its surroundings, wherein said method comprises the steps of establishing at least one electric node along the length of the elongate member by applying a respective variable electric signal to each end of the elongate member so that electric current is driven along the elongate member, said node being where the net difference in potential between the elongate member and its surroundings is substantially zero, varying the position of the said at least one node along the elongate member by varying the applied signals, monitoring the impedance of the elongate member as the position of the node is varied, identifying the position of the node at which the impedance has a local minimum and using that identified position as an indication of the position at which there is a current leakage path.

The node may be established by applying a respective electric signal to each end of the elongate member so that current is driven along the elongate member. The position of the node may be varied by varying the signals applied to the ends of the elongate member.

The preferred method of identifying the position of the node involves modeling the potential distribution along the length of the elongate member and using this to estimate the position of the node. The model may be improved using iterative techniques by estimating the impedance of the pipe using the model, comparing the estimated value with the measured impedance, and, if necessary, updating the model, this being repeated until the value of the impedance estimated using the model is substantially in agreement with the measured value. The model can then be used to estimate the position of the node.

According to another aspect of the invention there is provided apparatus for detecting and locating electric current leakage paths along the length of an electrically conducting elongate member which in its ideal condition is substantially insulated from its surroundings, the leakage paths and the surroundings being such that current can leak from the said elongate member to its surroundings, in which the apparatus comprises variable electrical signal supply means for connection to the elongate member, wherein said apparatus also comprises means for monitoring the impedance of the elongate member, said variable supply means is operable to drive current along the elongate member so that at least one node is established at a position along the length of the elongate member, the node being where the net change in potential between the elongate member and its surroundings is substantially zero, and wherein the position of the node is varied by varying the current driven by the supply means, the arrangement being such that in use the position of the node is varied and the resulting impedance of the elongate member is monitored, the position of the node at which the impedance has a local minimum indicating the position at which there is a current leakage path.

The supply means may be connected to the elongate member through connection points provided for a cathodic protection system. The position of the node may be varied by varying the potential applied to the ends of the elongate member. The supply means may be DC or AC voltage supplies. With an AC supply, there may be more than one node formed along the length of the elongate member, depending on the frequency of the voltage source.

For DC measurements, the means for monitoring current may be an ammeter. For AC measurements the means for monitoring current may be an ammeter and a shunt resistor with an oscilloscope, or other means for data acquisition, to determine the phase of the measured current with respect to the applied potential.

The location of the current leakage paths may be determined by making a coarse estimate of the position of the leakage path and then repeating the steps of the method on a portion of the elongate member in which the coarse estimate indicates there is a leakage path, to thereby provide a more accurate estimate. This process may be repeated several times.

Where there is more than one leakage path, there will be a series of local minima in the graph of impedance of the elongate member against the position of the node, each one corresponding to a leakage path.

The electrically conducting elongate member may be a pipe or a cable.

In the case of underwater pipes, there is a particular problem when the sea bed underneath a pipe is eroded so that sections of the pipe span hollows in the sea basin. When this happens, the motion of the tide may cause oscillations of the order of a few tenths of the diameter of the pipe, initially in the direction of the tidal flow. However, if the oscillations are allowed to progress then the span may increase. If concrete weight coating is fitted to the pipe this may be shed thereby resulting in the pipe oscillating in a direction perpendicular to the tidal flow with an amplitude of one or more diameters. This can cause severe structural damage and has significant safety implications.

Underwater pipes are checked typically by routinely scanning the pipe with a camera and when necessary identifying the position of regions of the pipe which are spanning hollows in the sea basin. When a region of the pipe is identified as spanning a hollow, remedial work is required to stabilize the pipe. Usually this is achieved by filling the hollow with rock or using so-called concrete mattresses. This is an extremely costly process, particularly in relation to the detection of the regions of the pipe which span hollows in the sea basin.

Another object of this invention is to provide an improved method of detecting oscillations of an underwater pipe.

According to yet another aspect of this invention there is provided a method of detecting oscillatory motion of an underwater electrically conducting elongate member comprising monitoring the impedance of the elongate member as a function of time, comparing the measured impedance with an expected impedance and using this information to determine whether or not the elongate member is oscillating.

The elongate member may be a pipeline or a cable.

The expected impedance may be calculated using a theoretical model of the impedance of the pipe, or may be determined from the results of the previous monitoring of the impedance of the pipe as a function of time.

The method is preferably utilized as part of a continuous monitoring process, throughout the working lifetime of the pipe.

BRIEF DESCRIPTION OF THE DRAWINGS

A method of detecting and locating a current leakage path on a pipe, and method of detecting oscillations of an underwater pipe will now be described by way of example with reference to the accompanying drawings of which.

DESCRIPTION OF THE PREFERRED EMBODIMENTS

Figure 1:
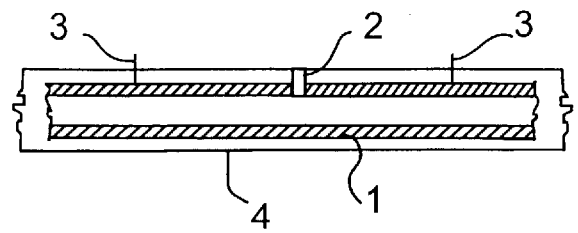
FIG. 1 is a longitudinal section of a length of pipe.

The method of detecting and locating current leakage paths in which the present invention is embodied may be applied to an electrically conducting pipe, or a cable, or any other electrically conducting elongate member, which, as is shown in FIG. 1, is provided with an electrical insulator 4 which in its ideal state electrically insulates the pipe, or cable, or elongate member from its surroundings. The surroundings should be able to act as an electrical ground, so pipes 1 underground or under water are suitable for the application of the method. Most such pipes 1 are provided with electrical connection points 3 to allow the pipe 1 to be tested and/or to allow a cathodic protection system to be utilized.

Figure 2:
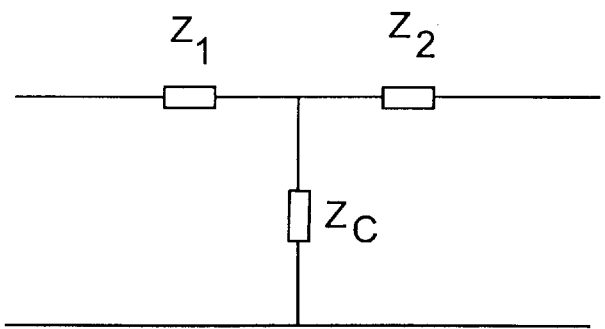
FIG. 2 is a representation of the pipe with a single corrosion point.

Corrosion or other forms of damage, for example piercing of the insulator 4, along the length of the pipe 1, may result in electric current leakage paths being formed between the electrically conducting pipe 1 and its surroundings. For the sake of simplicity, firstly consider a pipe 1 with a single point of corrosion 2 which can be represented as a T-junction of electrical impedances, as shown in FIG. 2, in which $Z_1$ and $Z_2$ represent the impedance of the pipe 1 in regions adjacent the corrosion 2, and $Z_c$ represents the corrosion impedance, which is in contact with the surroundings.

Figure 3:
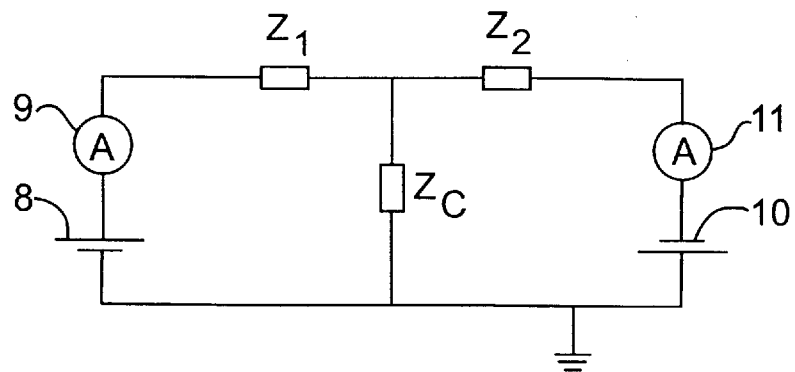
FIG. 3 is an equivalent circuit for one arrangement for carrying out the present invention.
Figure 4:
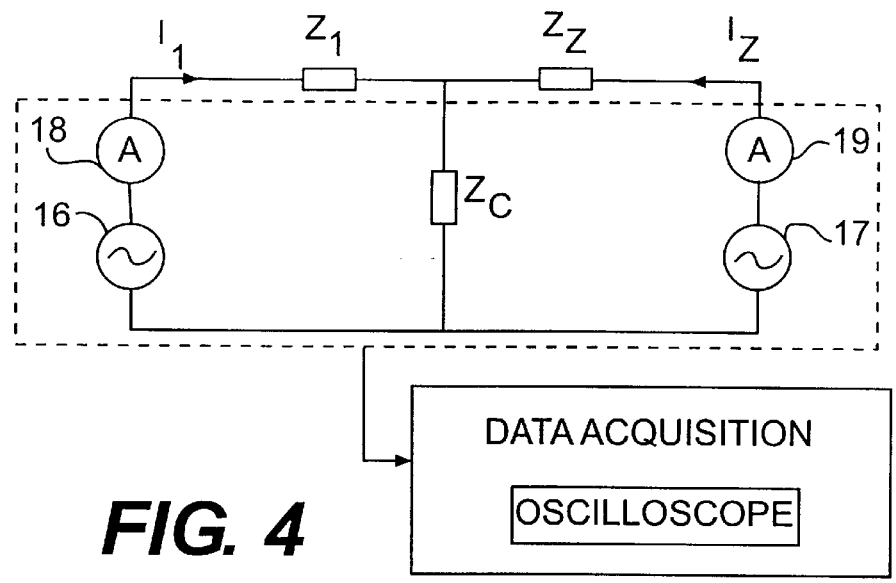
FIG. 4 is an equivalent circuit for another arrangement for carrying out the present invention.

To detect and locate corrosion, two voltage supplies are connected one at each end of the pipe 1, with each voltage supply being connected in series with an ammeter. Equivalent circuits for this arrangement are shown in FIGS. 3 and 4 for DC and AC voltage supplies respectively. The voltage applied to the ends of the section of the pipe under examination are selected so that a node is formed at a position along the pipe, the node being where the net difference in potential between the pipe and ground of the circuit is zero volts. For the sake of simplicity, the method of the present invention will be described assuming that the ground is at substantially the same potential as the potential of the surroundings. However, it will be understood that there may be a potential difference between the surroundings and the pipe, which would have to be taken into account in any calculations.

Figure 5:
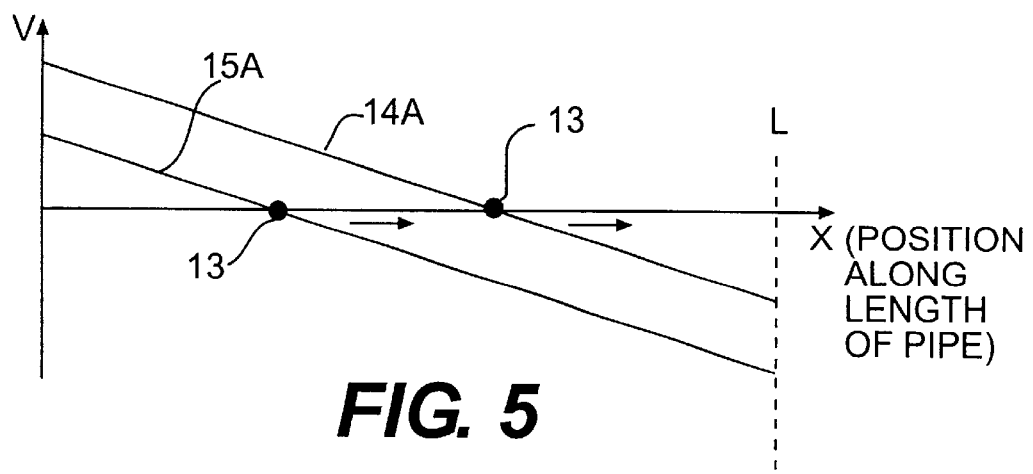
FIG. 5 is a graph of voltage against length of pipe for the arrangement shown in FIG. 3.

Using DC supplies 8 and 10 as shown in FIG. 3, a node can be established by connecting a positive voltage supply 8 to one end of the pipe and a negative voltage supply 10 to the other end with both supplies 8 and 10 having a common ground, at substantially the same potential as the surroundings. On an ideal pipe, the voltage distribution is linear along the length of the pipe 1, as shown in FIG. 5. The node 13 is the point at which the voltage is at substantially zero volts.

The node 13 can be moved along the length of the pipe 1 by varying the voltage supplies 8 and 10. In FIG. 5 the lines 14A and 15A are the voltage distribution plots for two different sets of voltages applied to the ends of the pipe 1, each set of voltages resulting in a node 13 being established at a different position along the length of the pipe 1. When the position of the node 13 coincides with the position of the corrosion 2, which forms a leakage path to the surroundings, that is the common ground potential, the potential difference across the impedance $Z_c$ is 0 volts and so no current flows in the leakage path. Therefore, the current measured at each end of the pipe 1 by ammeters 9 and 11 should be substantially the same. When the position of the node 13 does not coincide with the position of the corrosion 2, the potential difference across the impedance $Z_c$ is finite and so current flows in the leakage path through $Z_c$, so that the current measured at each end of the pipe by ammeters 9 and 13 is not the same. Hence, the impedance of the pipe 1 should be when the position of the node 13 coincides with the position of the corrosion 2 than it is when the position of the node does not coincide with the position of the corrosion 2. Therefore, by modeling the position of the node 13 as a function of the voltage supplied at either end of the pipe 1 and measuring the impedance of the pipe 1 as a function of the position of the node 13, the position of the corrosion 2 can be identified from the minima in the graph of impedance of the pipe against the position of the node 13.

Figure 7:
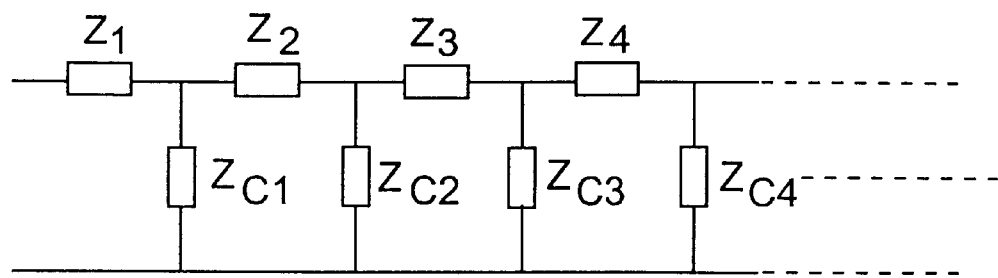
FIG. 7 is a representation of a pipe with i (i=1, 2, 3 . . . ) leakage paths.

When there is more than one leakage path resulting in a series of $Z_{ci}$ impedances to ground (where i=1,2,3 . . . ) the pipe can be represented as a distributed network of T-junctions, as shown in FIG. 7. The position of each corrosion point 2 can be estimated from the position of local minima on a graph of the impedance measured from the ends of the pipe 1 against position of the node 13. It would be necessary under these circumstances to use iterative techniques to accurately determine the position of corrosion 2.

If there are no electric current leakage paths to the surroundings then the impedance of the pipe 1 should be substantially constant, as a function of the position of the node 13 along the pipe 1.

If a cathodic protection system is in use along the length of the pipe, then it is necessary to take the voltage applied by this system into account when selecting the DC voltages to be applied at the ends of the pipes.

To determine the position of electric current leakage paths using AC voltage supplies, techniques similar to those used for DC voltage supplies are employed. The circuit used is shown in FIG. 4.

Figure 6:
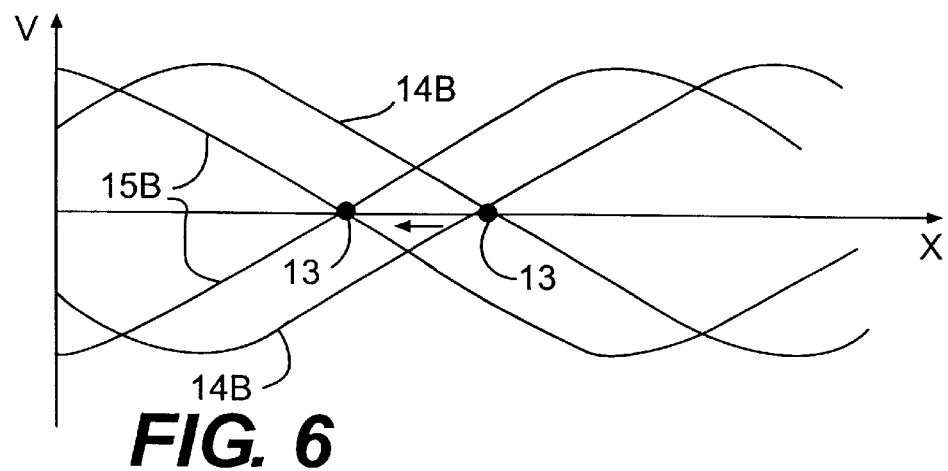
FIG. 6 is a graph of voltage against length of pipe for the arrangement shown in FIG. 4.

Using AC voltage supplies 16 and 17, a node 13 can be established by connecting a first AC voltage supply 16 to one end of the pipe and a second AC voltage supply 17 to the other end of the pipe and applying voltages selected so that an equal current flows from each end of the pipe but in opposite directions, the voltages supplied are phase locked to the same frequency, with an analytically determined phase and amplitude. This results in an electrical standing wave forming along the length of the pipe. On an ideal pipe 1, the voltage distribution along the length of the pipe as a result of applying equal AC voltages to opposite ends of the pipe 1 is represented by a standing wave, as shown in FIG. 6. The node 13 is the point at which the voltage is at substantially zero volts. In this case the frequency of the AC voltage supply is such that only one node 13 is formed. In order to ensure that the supplies are of suitable phase, frequency and amplitude, the two supplies 16 and 17 should be phase locked together and the amplitude of each should be carefully controlled.

The node 13 can be moved along the length of the pipe 1 by varying the AC voltage supplies 16 and 17, for example by varying the phase of the signals supplied. In FIG. 6, lines 14B and 15B are voltage distribution plots for two different sets of AC voltages applied to the ends of the pipe 1, each set of voltages having a different phase, thereby resulting in a node 13 being established at a different position along the length of the pipe 1. The techniques used to determine the position of electric current leakage paths are similar to those described for the DC supplies. Again, the position of the node 13 is moved along the length of the pipe 1 and the corresponding impedance between the ends of the pipe 1 is measured.

When AC supplies are employed, the effects of a cathodic protection system are less significant than when DC supplies are employed.

If more than one node 13 is formed along the length of the pipe iterative techniques may be required to determine the position of any electric current leakage paths. Although, if practicably possible, the frequency will be chosen to avoid multiple nodes.

When using AC supplies it may be necessary to make corrections to the estimate of the position of the node 13 to take into account any attenuation of the signal along the length of the pipe 1. This is particularly of significance for underwater pipelines as the attenuation increases very significantly with frequency.

It is proposed that the model of the pipe is updated and verified by using it to calculate a theoretical value of the impedance and comparing this with the measured value. When a discrepancy occurs the model is altered to account for this. This is repeated in an iterative manner under software control until there is convergence.

In order to accurately determine the location of any leakage paths along the length of a pipe using the method described above, it may be necessary to make a coarse estimate of the located of the leakage paths and then probe the pipe within the region indicated by the initial coarse estimate to make a more accurate second estimate. This may need to be repeated several times.

Figure 8:
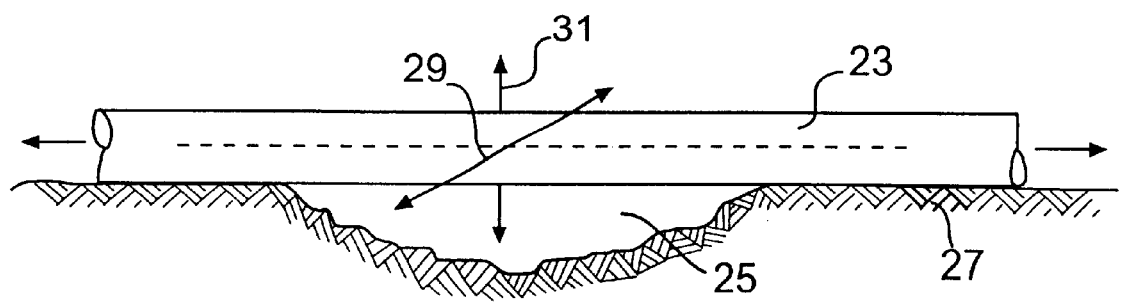
FIG. 8 is an underwater pipe which is resting on the sea bed, part of which has been eroded away.

FIG. 8 shows a pipe 23 which is spanning a hollow 25 in the sea bed 27. The length of the section of the pipe spanning the hollow can be of the order of 100 meters. Hence, any oscillation of such a section due to the motion of the tide can cause severe structural damage to the pipe. The motion of the tide may cause the section of the pipe to oscillate either in the direction 29 of the tide or in a direction 31 which is perpendicular to the direction 29 of the tide.

When a metal pipe is immersed in water the surface of the pipe is covered with a fixed layer of positive charge. This layer attracts mobile ions in the water which move towards the pipe's surface to form a diffuse mobile layer. The diffuse mobile layer is held near the bar by electrostatic attraction. The fixed layer charge and the diffuse mobile layer are together an electrical double layer which can act as a capacitor with a fixed plate and a moveable plate. This capacitor can be charged and discharged like any other capacitor.

The impedance of the double layer capacitor can be measured by connecting an AC supply between the pipe and ground. The application of an AC voltage to the pipe causes the mobile layer to move from a minimum radial distance from the pipe to a maximum radial distance from the pipe, as the voltage swings from its maximum to its minimum value. Hence, the mobile layer oscillates towards and away from the pipe.

The diffuse mobile layer is also affected by the motion of the tide which can cause it to move towards and away from the fixed layer of the pipe. The capacitance of the double layer is inversely proportional to the distance between the fixed layer of charge and the mobile layer of charge. Hence, the impedance of the double layer capacitor varies depending on the tidal motion. This motion can be characterized by continuously monitoring the impedance of the pipe. If any region of the pipe is oscillating freely, then the impedance should vary as a function of time in a manner which cannot be accounted for solely by taking into account the motion of the tide. Hence, by measuring the impedance of the pipe as a function of time, oscillations of that pipe can be detected.

The detection of the oscillation of pipes when oscillating in the direction of tidal flow is highly advantageous as at this stage the damage may not be significant. The variation in the impedance as a result of such oscillations may be very small. Therefore, the impedance should be measured in a very narrow band width.

The measurement of the impedance of the pipe as a function of time may be used to calculate the frequency of oscillation of the oscillating section of pipe, the mode of that oscillation and the length of the section of pipe which is so oscillating.

Ideally the impedance of the pipe should be measured as part of a continuous monitoring process, throughout the working lifetime of a pipe. Continuous monitoring increases the accuracy with which oscillations can be detected and improves on the reliability of the detection.

The detection of oscillations of a pipe, by monitoring its impedance and comparing the measured value with an expected value, enables the elimination of routine visual inspection of the pipe and so greatly reduces the cost of maintaining the pipe. It restricts the need for inspection of the pipe to when oscillation of the pipe is detected.

It is envisaged that the impedance data may also be used to locate the position of the sections of pipe which are oscillating, thereby eliminating the need for inspection of the pipe altogether.

What is claimed is:

1. A method of detecting and locating electric current leakage paths along the length of an electrically conducting elongate member having opposite ends and which in an ideal state is electrically insulated from its surroundings, said leakage paths and said surroundings being such that current can leak from the elongate member to said surroundings, comprising the steps of:

establishing at least one electric node along the length of the elongate member by applying a respective variable electric signal to each of the opposite ends of the elongate member so that electric current is driven along the elongate member, said at least one node being established where the net difference in potential between the elongate member and said surroundings is substantially zero;

varying the electric signals that are applied to each end of the elongate member so as to move said at least one node along the elongate member;

monitoring the impedance of the elongate member from a selected one of the opposite ends of the elongate member as the position of said at least one node is varied;

identifying a position of said at least one node at which the monitored impedance has a local minimum; and using an identified position as an indication of a position at which there is a current leakage path.

2. A method according to claim 1, wherein the step of monitoring the impedance comprises measuring the current at the ends of the elongate member.

3. A method according to claim 1, wherein the signals applied are DC.

4. A method according to claim 1, wherein the signals applied are AC.

5. A method of detecting and locating electric current leakage paths along the length of an electrically conducting elongate member having opposite ends and which in an ideal state is electrically insulated from its surroundings, said leakage paths and said surroundings being such that current can leak from the elongate member to said surroundings, comprising the steps of:

establishing at least one electric node along the length of the elongate member by applying a respective variable electric signal to each of the opposite ends of the elongate member so that electric current is driven along the elongate member, said at least one node being established where the net difference in potential between the elongate member and said surroundings is substantially zero;

varying the electric signals that are applied to each end of the elongate member so as to move said at least one node along the elongate member;

monitoring the impedance of the elongate member from a selected one of the opposite ends of the elongate member as the position of said at least one node is varied;

identifying a position of said at least one node at which the monitored impedance has a local minimum; and using an identified position as an indication of a position at which there is a current leakage path, wherein the signals that are applied to each end of the elongate member are AC signals and the position of said at least one node is varied by varying the phase of the AC signals.

6. A method of detecting and locating electric current leakage paths along the length of an electrically conducting elongate member having opposite ends and which in an ideal state is electrically insulated from its surroundings, said leakage paths and said surroundings being such that current can leak from the elongate member to said surroundings, comprising the steps of:

establishing at least one electric node along the length of the elongate member by applying a respective variable electric signal to each of the opposite ends of the elongate member so that electric current is driven along the elongate member, said at least one node being established where the net difference in potential between the elongate member and said surroundings is substantially zero;

varying the electric signals that are applied to each end of the elongate member so as to move said at least one node along the elongate member;

monitoring the impedance of the elongate member from a selected one of the opposite ends of the elongate member as the position of said at least one node is varied;

identifying a position of said at least one node at which the monitored impedance has a local minimum; and using an identified position as an indication of a position at which there is a current leakage path, wherein the step of identifying the position of said at least one node comprises modeling the potential distribution along the length of the elongate member and using the resulting model to estimate the position of said at least one node.

7. A method according to claim 6, wherein the step of identifying the position of said at least one node comprises estimating the impedance of the elongate member using the model, comparing the estimated value with the measured impedance, and, if necessary, updating the model, this being repeated until the value of the impedance estimated using the model is substantially in agreement with the measured value.

8. A method of detecting and locating electric current leakage paths along the length of an electrically conducting elongate member having opposite ends and which in an ideal state is electrically insulated from its surroundings, said leakage paths and said surroundings being such that current can leak from the elongate member to said surroundings, comprising the steps of:

establishing at least one electric node along the length of the elongate member by applying a respective variable electric signal to each of the opposite ends of the elongate member so that electric current is driven along the elongate member, said at least one node being established where the net difference in potential between the elongate member and said surroundings is substantially zero;

varying the electric signals that are applied to each end of the elongate member so as to move said at least one node along the elongate member;

monitoring the impedance of the elongate member from a selected one of the opposite ends of the elongate member as the position of said at least one node is varied;

identifying a position of said at least one node at which the monitored impedance has a local minimum; and using an identified position as an indication of a position at which there is a current leakage path, wherein the respective positions of a plurality of leakage paths are estimated by identifying the position of said at least one node for each of a plurality of locations along the elongate member at which the monitored impedance has a local minimum, each of said locations corresponding to a leakage path.

9. A method of detecting and locating electric current leakage paths along the length of an electrically conducting elongate member having opposite ends and which in an ideal state is electrically insulated from its surroundings, said leakage paths and said surroundings being such that current can leak from the elongate member to said surroundings, comprising the steps of:

establishing at least one electric node along the length of the elongate member by applying a respective variable electric signal to each of the opposite ends of the elongate member so that electric current is driven along the elongate member, said at least one node being established where the net difference in potential between the elongate member and said surroundings is substantially zero;

varying the electric signals that are applied to each end of the elongate member so as to move said at least one node along the elongate member;

monitoring the impedance of the elongate member from a selected one of the opposite ends of the elongate member as the position of said at least one node is varied;

identifying a position of said at least one node at which the monitored impedance has a local minimum; and using an identified position as an indication of a position at which there is a current leakage path, wherein any such an identified position is used as a coarse estimate of the position of the leakage path, thereby identifying a particular portion of the elongate member in which there is a leakage path, and wherein the steps of the method are repeated on that portion to thereby provide a more accurate estimate.

10. A method according to claim 1, wherein the elongate member is a pipeline or a cable.

11. A method according to claim 1, wherein the variable signal supply means is connected to the elongate member through connection points provided for a cathodic protection apparatus.

12. Apparatus for detecting and locating electric current leakage paths along the length of an electrically conducting elongate member having opposite ends and which, in an ideal condition, is substantially insulated from its surroundings, the leakage paths and the surroundings being such that current can leak from the said elongate member to said surroundings, wherein the apparatus comprises:

first variable electric signal supply means for connection to one of the opposite ends of the elongate member;

second variable electric signal supply means for connection to the other of the opposite ends of the elongate member, said first and second variable electric signal supply means being operable to drive current along the elongate member so that at least one node is established at a position along the length of the elongate member, said at least one node being where the net change in potential between the elongate member and its surroundings is substantially zero, and wherein the position of said at least one node is varied by varying the current driven by the respective first and second variable electric signal supply means, and means for monitoring the impedance of the elongate member as electric signals applied to each end of the elongate member are varied by operation of the first and second variable electric signal supply means, the arrangement being such that in use, the position of said at least one node is varied, the resulting impedance of the elongate member is monitored, and any position of said at least one node at which the monitored impedance has a local minimum is identified and used as an indication of the position at which there is a current leakage path.

13. Apparatus for detecting and locating electric current leakage paths according to claim 12, wherein said variable electric signal supply means comprises a DC voltage supply or an AC voltage supply.

14. Apparatus for detecting and locating electric current leakage Paths according to claim 12, wherein the means for monitoring the impedance comprises an ammeter.

15. Apparatus for detecting and locating electric current leakage paths along the length of an electrically conducting elongate member having opposite ends and which, in an ideal condition, is substantially insulated from its surroundings, the leakage paths and the surroundings being such that current can leak from the said elongate member to said surroundings, wherein the apparatus comprises:

first variable electric signal supply means for connection to one of the opposite ends of the elongate member;

second variable electric signal supply means for connection to the other of the opposite ends of the elongate member;

said first and second variable electric signal supply means being operable to drive current along the elongate member so that at least one node is established at a position along the length of the elongate member, said at least one node being where the net change in potential between the elongate member and its surroundings is substantially zero, and wherein the position of said at least one node is varied by varying the current driven by the respective first and second variable electric signal supply means, and means for monitoring the impedance of the elongate member as electric signals applied to each end of the elongate member are varied by operation of the first and second variable electric signal supply means, the arrangement being such that in use, the position of said at least one node is varied, the resulting impedance of the elongate member is monitored, and any position of said at least one node at which the monitored impedance has a local minimum is identified and used as an indication of the position at which there is a current leakage path;

and further wherein said variable electric signal supply means comprises an AC voltage supply and the means for monitoring the impedance comprises an ammeter and data acquisition means operable to determine the phase of the signal measured by the ammeter with respect to the applied signal.

16. Apparatus for detecting and locating electric current leakage paths according to claim 15, wherein said data aquisition means comprises an oscilloscope.

17. Apparatus for detecting and locating electric current leakage paths according to claim 12, wherein said elongate member is a pipeline or a cable.

* * * * *